US008331108B2

(12) United States Patent
Lu

(10) Patent No.: US 8,331,108 B2
(45) Date of Patent: Dec. 11, 2012

(54) INTEGRATED POWER INSERTER

(75) Inventor: Shan-Jui Lu, Xizhi (TW)

(73) Assignee: Lantek Electronics Inc., Xizhi, Taipei County (TW)

( * ) Notice: Subject to any disclaimer, the term of this patent is extended or adjusted under 35 U.S.C. 154(b) by 353 days.

(21) Appl. No.: 12/730,438

(22) Filed: Mar. 24, 2010

(65) Prior Publication Data
US 2011/0170275 A1 Jul. 14, 2011

(30) Foreign Application Priority Data

Jan. 13, 2010 (TW) .............................. 99200651 U

(51) Int. Cl.
H05K 7/02 (2006.01)
(52) U.S. Cl. .......... 361/811; 361/119; 361/56; 361/113; 439/583; 348/707
(58) Field of Classification Search ............. 361/811; 439/588
See application file for complete search history.

(56) References Cited

U.S. PATENT DOCUMENTS 5,662,500 A * 9/1997 Yeah .............................. 439/732
6,064,448 A * 5/2000 Feng .............................. 348/707
7,701,309 B2 * 4/2010 Shapson ..................... 333/24 R

* cited by examiner

Primary Examiner — Tuan T Dinh
Assistant Examiner — Mukund G Patel
(74) Attorney, Agent, or Firm — Guice Patents PLLC

(57) ABSTRACT

The present invention relates to an integrated power inserter, comprises: a housing; a voltage lowering and rectifying member; and a coupling member having a power input end, a radio frequency signal coupling circuit, a radio frequency signal input end and a radio frequency signal output end, wherein the radio frequency signal input end is input with a radio frequency signal and outputs a power signal, the radio frequency signal output end outputs a radio frequency signal being coupled to a television; with the mentioned structure of the integrated power inserter, a power inserter can be integrated in a power adaptor for simplifying wire layout and lowering production cost.

7 Claims, 4 Drawing Sheets

INTEGRATED POWER INSERTER

BACKGROUND OF THE INVENTION

1. Field of the Invention

The present invention related to an integrated power inserter, especially to an integrated power inserter in which a power inserter is integrated in a power adapter for simplifying wire layout and lowering production cost.

2. Description of Related Art

A conventional indoor amplifier needs power so as to be operated, and there are two power sources: 1. the AC power source, about 90V, supplied by a CATV cable (often referred as supplying an outdoor line extender amplifier) and 2. a power inserter prepared by users. When the CATV cable is loaded with AC power, users may be hurt by electric shock during installation, so users often choose to buy a power inserter for supplying power to an indoor amplifier.

Referring to FIG. 1, which is a schematic view illustrating a conventional power inserter being connected to an active amplifier. As shown in the figure, a conventional power inserter 100 has a power input end 110, a radio frequency signal coupling circuit (not shown), a power and radio frequency signal input/output end 120 and a radio frequency signal output end 130, and an external power adapter 140 is needed for supplying the required DC power. When being operated, the external power adapter 140 is inserted into an AC power socket (not shown), then a cable 150 is connected to the power input end 110 of the power inserter 100, then another cable 160 is served to connect the power and radio frequency signal input/output end 120 to another amplifier 190, and another cable 170 is served to connect the radio frequency signal output end 130 to a television 180. So a radio frequency signal of the CATV cable is coupled by the radio frequency signal coupling circuit then is output to the television 180 through the radio frequency signal output end 130. Such connection manner can prevent users from being hurt by electric shock caused by the AC power source of the television cable during cable connection, but the cable 150 is needed for connecting the external power adapter 140 and the power inserter 100, the cable 150 not only occupies additional space and raise user's expenditure.

For improving the mentioned disadvantages of conventional power inserter, a novel integrated power inserter is provided by the present invention.

SUMMARY OF THE INVENTION

One primary object of the present invention is to provide an integrated power inserter in which a power inserter is integrated in a power adapter for simplifying wire layout and lowering production cost.

Another object of the present invention is to provide an integrated power inserter having advantages of simplifying components, reducing volume and lowering production cost.

For achieving the mentioned objects, the present invention provides an integrated power inserter, comprises a housing having a chamber, the bottom end thereof is installed with a pair of electric conductive sheets for being inserted into a socket for obtaining required AC power source; a voltage lowering and rectifying member disposed in the chamber, one end thereof is coupled to the pair of electric conductive sheets for lowering the voltage of the AC power source and rectifying to a DC power source; and a coupling member disposed in the chamber and installed with a metal housing in which a power input end, a radio frequency signal coupling circuit, a radio frequency signal input end and a radio frequency signal output end are installed; wherein the power input end is coupled to the DC power source for supplying power required by the radio frequency signal coupling circuit, the radio frequency signal input end and the radio frequency signal output end are exposed outside the housing, the radio frequency signal input end is coupled to a power inserter through a cable for obtaining a radio frequency signal, the radio frequency signal output end outputs a radio frequency signal to a video device.

DETAILED DESCRIPTION OF THE PREFERRED EMBODIMENT

Figure 1:
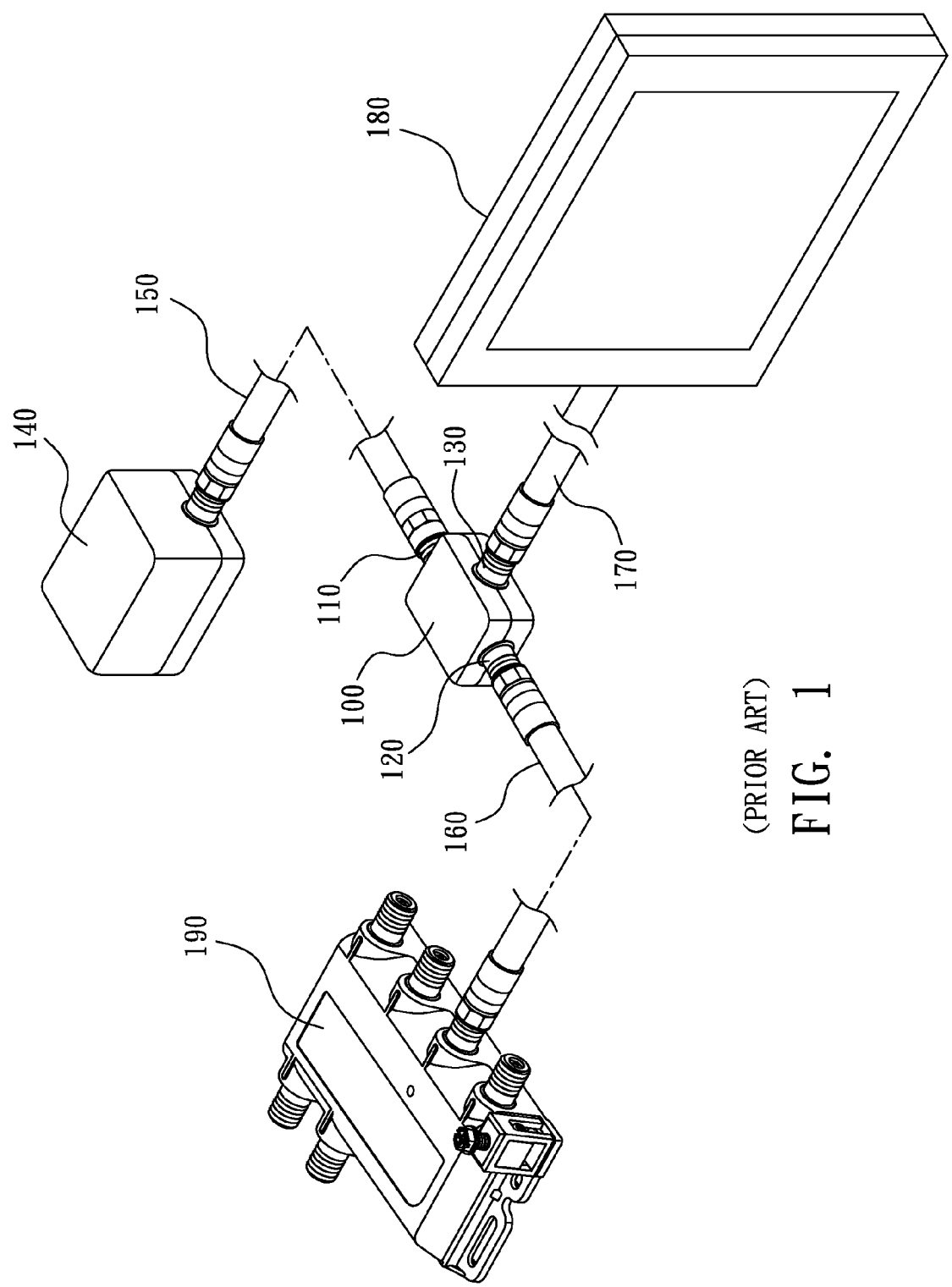
FIG. 1 is a schematic view illustrating a conventional power inserter being connected to an active amplifier.
Figure 2:
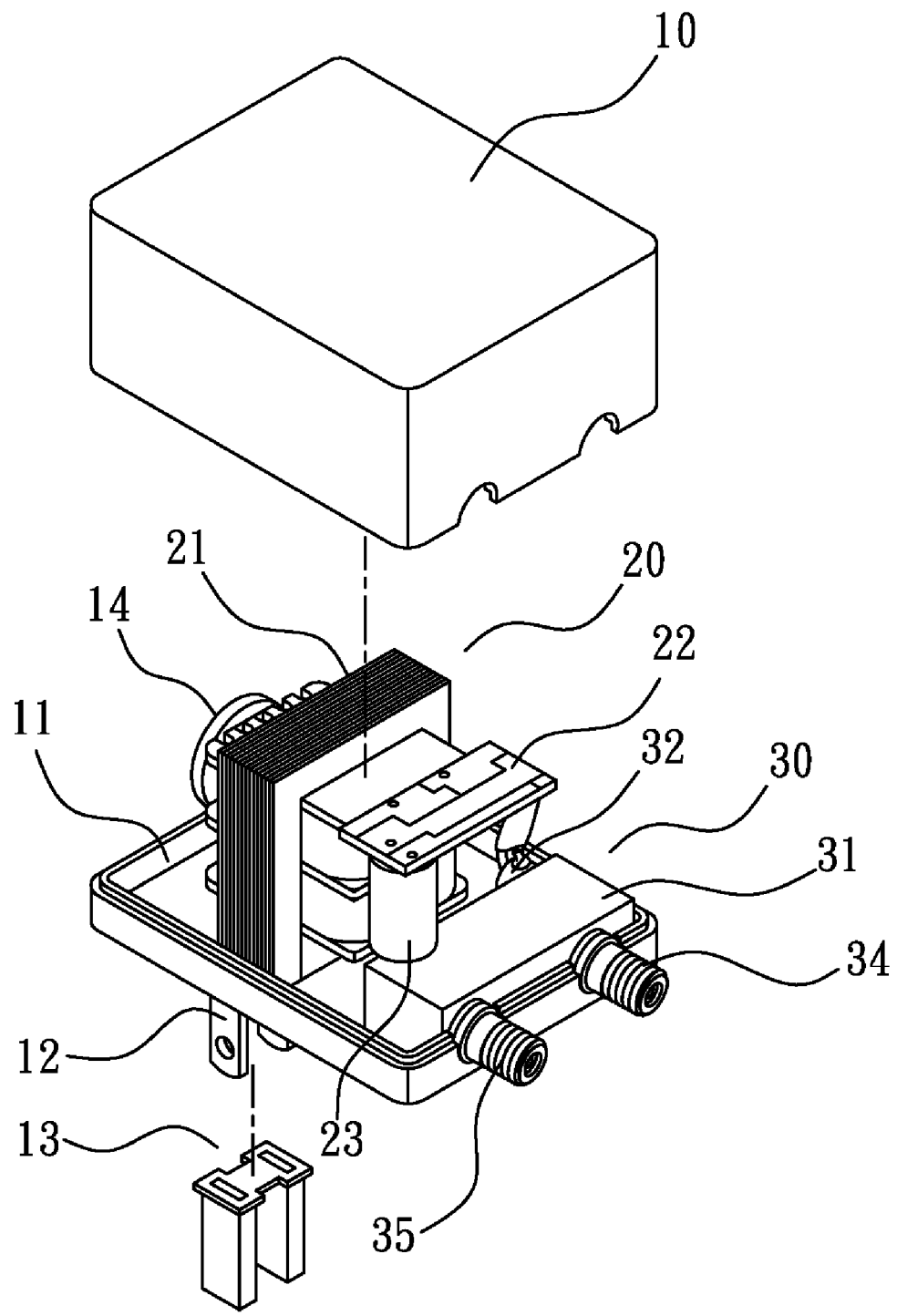
FIG. 2 is a schematic exploded view of the integrated power inserter of one preferred embodiment of the present invention.
Figure 3:
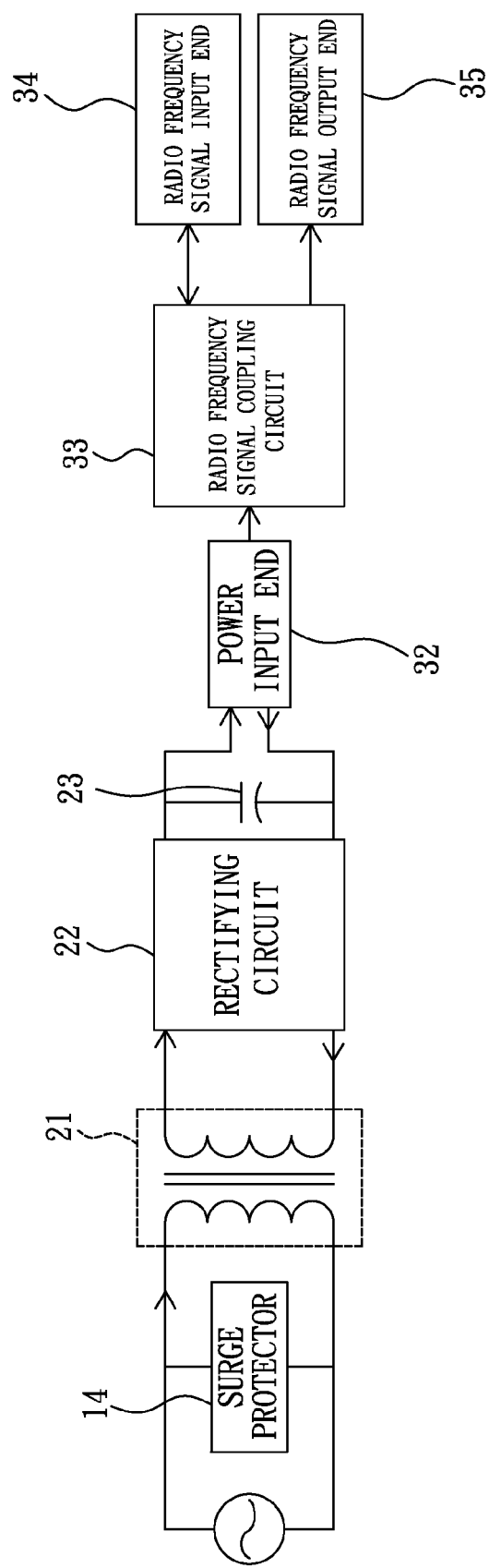
FIG. 3 is a schematic block view of the integrated power inserter of one preferred embodiment of the present invention.
Figure 4:
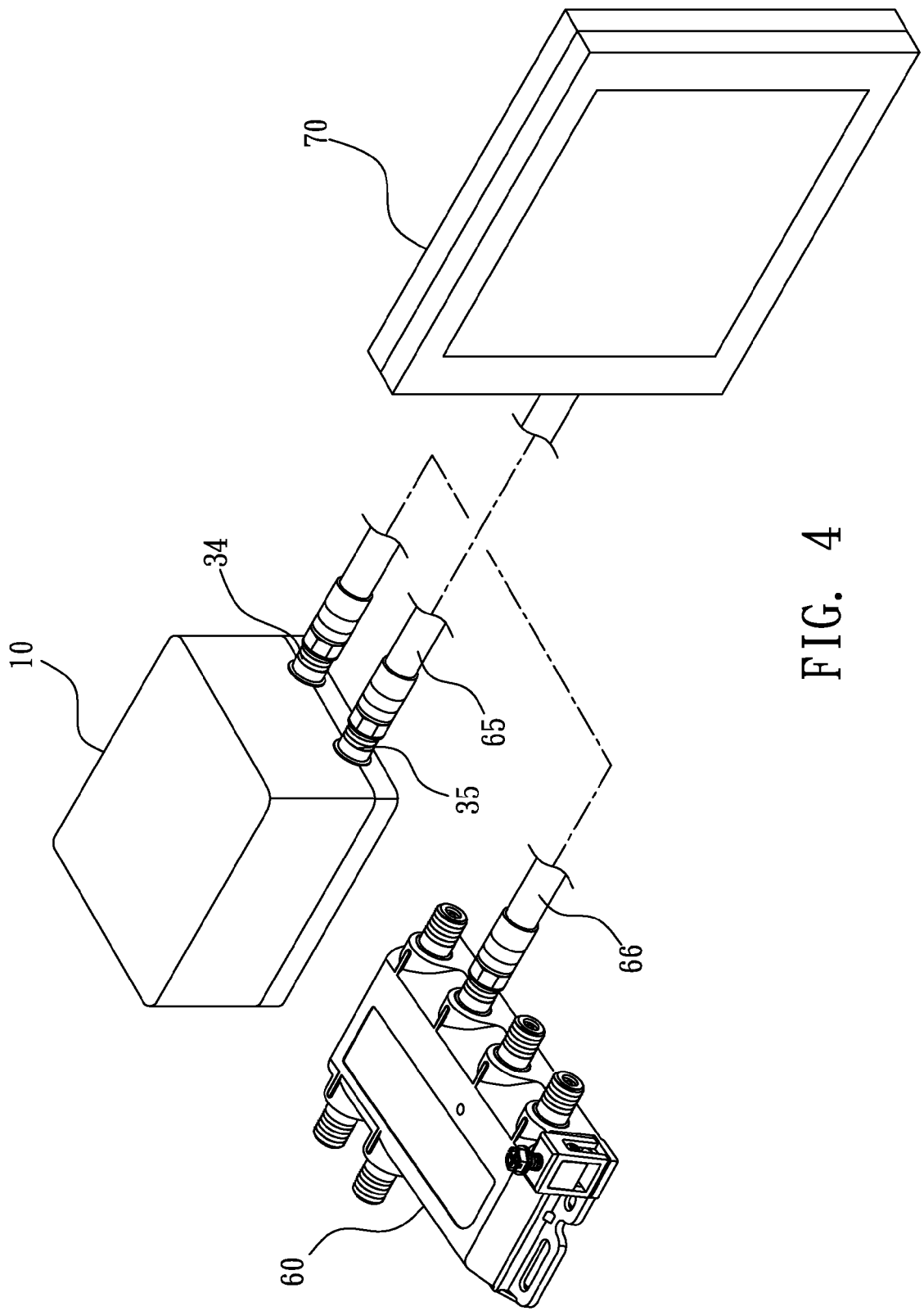
FIG. 4 is a schematic view illustrating the connection of the integrated power inserter of one preferred embodiment of the present invention.

Referring from FIG. 2 to FIG. 4, wherein FIG. 2 is a schematic exploded view of the integrated power inserter of one preferred embodiment of the present invention; FIG. 3 is a schematic block view of the integrated power inserter of one preferred embodiment of the present invention; FIG. 4 is a schematic view illustrating the connection of the integrated power inserter of one preferred embodiment of the present invention.

As shown in figures, the integrated power inserter provided by the present invention comprises: a housing 10; a voltage lowering and rectifying member 20; and a coupling member 30.

The housing 10 is installed with a chamber 11, and the bottom end of the housing 10 is installed with a pair of electric conductive sheets 12 for being inserted into a socket (not shown) for obtaining an AC power source, e.g. but not limited to 110V or 220V. The housing 10 is made of insulation material e.g. but not limited to plastic.

The voltage lowering and rectifying member 20 is disposed in the chamber 11, one end thereof is coupled to the pair of electric conductive sheets 12 for lowering the voltage of the AC power source then rectifying to a DC power source, e.g. but not limited to 15V. As shown in FIG. 2, the voltage lowering and rectifying member 20 further includes a transformer 21, a rectifying circuit 22 and a filter capacitor 23.

One primary side of the transformer 21 is coupled to the AC power source for lowering the voltage of the AC power source. One end of the rectifying circuit 22 is coupled to a secondary side of the transformer 21 for rectifying the voltage-lowered AC power source to the DC power source. The rectifying circuit 22 is, e.g. but not limited to, a full-wave rectifying circuit which is adopted in this embodiment for illustration. The DC power source is, e.g. but not limited to, +12V, +13.5V or +15V. Two pins of the filter capacitor 23 are respectively coupled to two output ends of the full-wave rectifying circuit 22 for filtering the DC power source so as to lower the ripple thereof.

The coupling member 30 is disposed in the chamber 11, and is installed with a metal housing 31 in which a power input end 32, a radio frequency signal coupling circuit 33, a power and radio frequency signal input end 34 and a radio frequency signal output end 35 are installed; wherein the power input end 32 is directly coupled to the DC power source for supplying power required by the radio frequency signal coupling circuit 33, the radio frequency signal input end 34 and the radio frequency signal output end 35 are exposed outside the housing 10, the radio frequency signal input end 34 is able to be coupled to another amplifier 60 for obtaining a radio frequency signal and transferring the DC power source to the amplifier 60, the radio frequency signal output end 35 is capable of outputting a radio frequency signal to a video device 70; wherein the frequency of the radio frequency signal is e.g. but not limited to 5 MHz~1002 MHz or 5 MHz~2300 MHz, the video device 70 is e.g. but not limited to a television or computer having a tuner.

The integrated power inserter provided by the present invention is further installed with a pair of protection seats 13 in which the pair of electric conductive sheets 12 are inserted for protecting the pair of electric conductive sheets 12. The protection seats 13 are made of insulation material, e.g. but not limited to plastic.

The integrated power inserter provided by the present invention is further installed with a surge protector 14, two pins of the surge protector 14 are respectively coupled to the AC power source for absorbing surges and protecting.

As shown in FIG. 4, when the integrated power inserter of the present invention is operated, the pair of electric conductive sheets 12 is inserted in an AC power socket after the protection seats 13 of the integrated power inserter are removed; then one end of a cable 65 is connected to the radio frequency signal output end 35, another end of the cable 65 is connected to the video device 70; lastly one end of another cable 66 is connected to the radio frequency signal input end 34, another end of the cable 66 is connected to the another amplifier 60 or a CATV cable (not shown), so the connection of the present invention is finished. A radio frequency signal input through the cable 66 is coupled by the radio frequency signal coupling circuit 33 then is output to the video device 70 through the radio frequency signal output end 35 and the cable 65, and the DC power source is transferred so as to be used by the amplifier 60. So during installation, users are free from worrying the danger of electric shock caused by the AC power source of CATV cable. The coupling member 30 of the present invention is integrated in the housing 10 of the power inserter and is connected to the interior of the housing 10 through wires, so a cable is saved, therefore the occupied space is reduced and user's cost is also saved. Thus the integrated power inserter provided by the present invention is novel compared to conventional power inserters.

As mentioned above, with the integrated power inserter of the present invention, the power inserter is integrated in a power adapter for simplifying wire layout and lowering production cost, so the integrated power inserter provided by the present invention is novel compared to conventional power inserters.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An integrated power inserter comprising:
    a housing having a chamber, the bottom end thereof installed with a pair of electric conductive sheets for being inserted in a socket for obtaining required AC power source;
    a voltage lowering and rectifying member disposed in said chamber, one end thereof coupled to said pair of electric conductive sheets for lowering the voltage of said AC power source and rectifying to a DC power source, said voltage lowering and rectifying member including:
        a transformer, a primary end thereof coupled to said AC power source for lowering the voltage of said AC power source;
        a rectifying circuit, one end thereof coupled to a secondary side of said transformer for rectifying the voltage-lowered AC power source to said DC power source; and
        a filter capacitor, two pins thereof respectively coupled to two output ends of said rectifying circuit for filtering said DC power source;
    a coupling member disposed in said chamber and installed with a metal housing in which a power input end, a radio frequency signal coupling circuit, a radio frequency signal input end and a radio frequency signal output end are installed; wherein said power input end is coupled to said DC power source for supplying said DC power required by an amplifier, said radio frequency signal input end and said radio frequency signal output end are exposed outside said housing, said radio frequency signal input end being input with a radio frequency signal and transferring said DC power source, said radio frequency signal output end outputs a radio frequency signal; and
    a surge protector having two pins thereof respectively coupled to said AC power source for providing surge protection;
    wherein said transformer is electrically connected between said surge protector and said rectifying circuit;
    wherein said transformer, said rectifying circuit and said filter capacitor of said voltage lowering and rectifying member, said coupling member, and said surge protector are located in said chamber of said housing.

2. The integrated power inserter as claimed in claim 1, wherein further being installed with a pair of protection seats in which said pair of electric conductive sheets is inserted for protecting said pair of electric sheets.

3. The integrated power inserter as claimed in claim 2, wherein said housing and said pair of protection seats are made of insulation material.

4. The integrated power inserter as claimed in claim 1, wherein said rectifying circuit is a full-wave rectifying circuit.

5. The integrated power inserter as claimed in claim 1, wherein said AC power source is 110V or 220V.

6. The integrated power inserter as claimed in claim 1, wherein said DC power source is +12V, +13.5V or +15V.

7. The integrated power inserter as claimed in claim 1, wherein said frequency of the radio frequency signal is 5 MHz~1002 MHz or 5 MHz~2300 MHz.

* * * * *